(12) United States Patent
Cheng et al.

(10) Patent No.: US 9,385,023 B1
(45) Date of Patent: Jul. 5, 2016

(54) METHOD AND STRUCTURE TO MAKE FINS WITH DIFFERENT FIN HEIGHTS AND NO TOPOGRAPHY

(71) Applicant: GLOBALFOUNDRIES INC., Grand Cayman (KY)

(72) Inventors: Kangguo Cheng, Schenectady, NY (US); Joel P. de Souza, Putnam Valley, NY (US); Ali Khakifirooz, Los Altos, CA (US); Alexander Reznicek, Troy, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/712,462

(22) Filed: May 14, 2015

(51) Int. Cl.
| | |
|---|---|
| *H01L 21/84* | (2006.01) |
| *H01L 21/336* | (2006.01) |
| *H01L 21/76* | (2006.01) |
| *H01L 27/12* | (2006.01) |
| *H01L 21/70* | (2006.01) |
| *H01L 21/762* | (2006.01) |
| *H01L 21/225* | (2006.01) |
| *H01L 21/283* | (2006.01) |
| *H01L 29/66* | (2006.01) |
| *H01L 29/78* | (2006.01) |
| *H01L 29/06* | (2006.01) |

(52) U.S. Cl.
CPC ...... *H01L 21/76243* (2013.01); *H01L 21/2253* (2013.01); *H01L 21/283* (2013.01); *H01L 21/76245* (2013.01); *H01L 29/0657* (2013.01); *H01L 29/66545* (2013.01); *H01L 29/66795* (2013.01); *H01L 29/785* (2013.01); *H01L 29/7855* (2013.01)

(58) Field of Classification Search
CPC ............... H01L 21/76243; H01L 21/76245; H01L 29/785; H01L 29/66795; H01L 29/66818; H01L 29/7855
USPC .......... 257/347, 368, 506, E27.112; 438/151, 438/294, 409
See application file for complete search history.

(56) References Cited

U.S. PATENT DOCUMENTS

| | | | |
|---|---|---|---|
| 5,950,094 A | * | 9/1999 | Lin .................. H01L 21/76245 148/DIG. 50 |
| 7,172,930 B2 | | 2/2007 | Adam et al. |
| 7,772,096 B2 | | 8/2010 | deSouza et al. |
| 8,207,027 B2 | | 6/2012 | Zhu et al. |
| 8,263,462 B2 | | 9/2012 | Hung et al. |
| 8,592,263 B2 | | 11/2013 | Standaert et al. |
| 8,674,449 B2 | | 3/2014 | Zhu et al. |
| 8,896,067 B2 | | 11/2014 | Bergendahl et al. |
| 2008/0128797 A1 | * | 6/2008 | Dyer .................... H01L 29/785 257/328 |

(Continued)

*Primary Examiner* — Karen Kusumakar
*Assistant Examiner* — Aaron Gray
(74) *Attorney, Agent, or Firm* — Scully, Scott, Murphy & Presser, P.C.

(57) ABSTRACT

A semiconductor structure is provided that contains silicon fins having different heights, while maintaining a reasonable fin height to width ratio for process feasibility. The semiconductor structure includes a first silicon fin of a first height that is located on a first buried oxide structure. The structure further includes a second silicon fin of a second height that is located on a second buried oxide structure that is spaced apart from the first buried oxide structure. The second height of the second silicon fin is greater than the first height of the first silicon fin, yet a topmost surface of the first silicon fin is coplanar of a topmost surface with the second silicon fin.

13 Claims, 10 Drawing Sheets

(56) References Cited

U.S. PATENT DOCUMENTS

| | | | |
|---|---|---|---|
| 2008/0283918 A1* | 11/2008 | Cheng | H01L 21/2652 257/347 |
| 2010/0258870 A1* | 10/2010 | Hsu | H01L 29/785 257/347 |
| 2015/0021697 A1* | 1/2015 | Colinge | H01L 29/7848 257/368 |

* cited by examiner

METHOD AND STRUCTURE TO MAKE FINS WITH DIFFERENT FIN HEIGHTS AND NO TOPOGRAPHY

BACKGROUND

The present application relates to a semiconductor structure and a method of forming the same. More particularly, the present application relates to a semiconductor structure containing silicon fins located on a buried oxide structure and having different heights, yet having topmost surfaces that are coplanar with each other. The present application also provides a method of forming such a semiconductor structure.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs.

Double-gated FinFETs allow the scaling to continue for the next two to three generations. However, due to the three-dimensional nature of the device, the device width (in this case fin height) cannot be varied as desired. For example and in SRAM devices, the device width ratio for pull-up and pull-down FET devices is an important parameter. In conventional (i.e., planar) circuits, this ratio can be randomly chosen by the designers to benefit the circuits even with cell size constrains. However, the device width for FinFETs is determined by the number of fins (n Fins) times (X) the fin height (h Fin) and designers cannot use as many fins as they wish due to cell size (footprint) constrains, hence the FinFET device width ratio is limited in FinFET circuits.

In view of the above, the is a need to provide a semiconductor structure containing silicon fins having different heights, while maintaining a reasonable fin height to width ratio for process feasibility.

SUMMARY

In one aspect of the present application, a method of forming a semiconductor structure is provided. In accordance with an embodiment of the present application, the method includes providing a bulk semiconductor substrate of, from bottom to top, a silicon base layer having a p-type conductivity and a first dopant concentration, and a boron doped silicon layer having a second dopant concentration that is less than the first dopant concentration. Next, a sacrificial trench isolation structure is formed within the boron doped silicon layer to define a first boron doped silicon portion and a second boron doped silicon portion. A first porous silicon region of a first depth is formed in the first boron doped portion and is located beneath a remaining topmost portion of the first boron doped silicon portion, and a second porous silicon region of a second depth is formed in the second boron doped portion and located is beneath a remaining topmost portion of the second boron doped silicon portion, wherein the second depth is greater than the first depth. The first porous silicon region is converted into a first buried oxide structure of the first depth and the second porous silicon region is converted into a second buried oxide structure of the second depth. Next, the remaining topmost portion of the first boron doped silicon portion is patterned to provide a first silicon fin of a first height on the first buried oxide structure, and the remaining topmost portion of the second boron doped silicon portion is also patterned to provide a second silicon fin of a second height on the second buried oxide structure, wherein the second height is greater than the first height, yet the topmost surfaces of each first silicon fin and each second silicon fin are coplanar with each other.

In another aspect of the present application, a semiconductor structure is provided that contains silicon fins having different heights, while maintaining a reasonable fin height to width ratio for process feasibility. In one embodiment of the present application, the semiconductor structure includes a first silicon fin of a first height that is located on a first buried oxide structure. The structure further includes a second silicon fin of a second height that is located on a second buried oxide structure that is spaced apart from the first buried oxide structure. In accordance with the present application, the second height of the second silicon fin is greater than the first height of the first silicon fin, yet a topmost surface of the first silicon fin is coplanar with a topmost surface of the second silicon fin. The structure further includes a contiguous boron doped silicon portion directly contacting a bottommost surface of the first buried oxide structure and a bottommost surface of the second buried oxide surface. The structure even further includes a silicon base layer having a topmost surface directly contacting a bottommost surface of the contiguous boron doped silicon layer portion, wherein the silicon base layer has a p-type conductivity and a dopant concentration that is greater than a concentration of boron present in the boron doped silicon portion.

DETAILED DESCRIPTION

Figure 1:
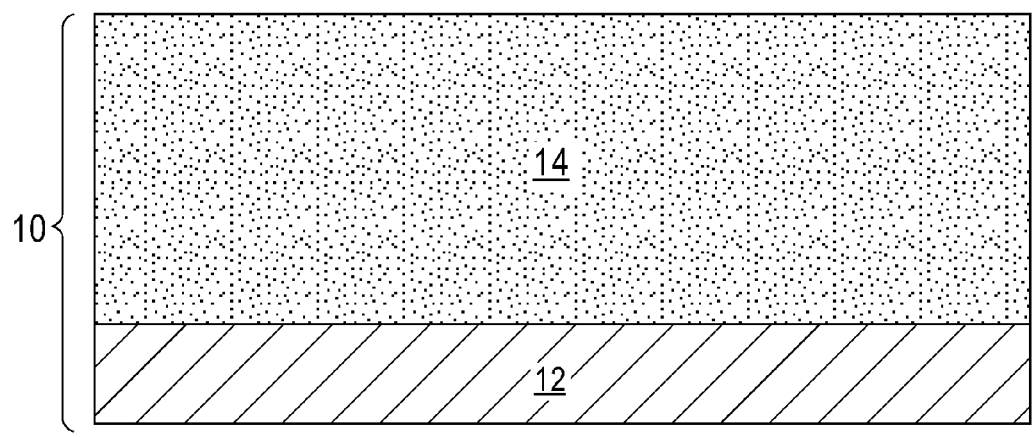
FIG. 1 is a cross sectional view of an exemplary semiconductor structure including a bulk semiconductor substrate of, from bottom to top, a silicon base layer having a p-type conductivity and a first dopant concentration, and a boron doped silicon layer having a second dopant concentration that is less than the first dopant concentration in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including a bulk semiconductor substrate 10 of, from bottom to top, a silicon base layer 12 having a p-type conductivity and a first dopant concentration, and a boron doped silicon layer 14 having a second dopant concentration that is less than the first dopant concentration that can be employed in accordance with an embodiment of the present application.

As mentioned above, the bulk semiconductor substrate 10 of FIG. 1 includes a silicon base layer 12 having a p-type conductivity and a first dopant concentration. By "p-type conductivity" it is meant that the silicon base layer 12 contains a p-type dopant. The term "p-type dopant" denotes an impurity (e.g., dopant) that when added to an intrinsic semiconductor material creates deficiencies of free electrons in the intrinsic semiconductor material. For silicon, boron, aluminum, gallium and/or indium may be used a p-type impurity. Typically, boron is used in the present application as the dopant that provides the p-type conductivity to the silicon base layer 12. The first dopant concentration of the p-dopant that may be present in the silicon base layer 12 can be from $5 \times 10^{18}$ atom/cm$^3$ to $1 \times 10^{20}$ atoms/cm$^3$. The p-type dopant can be introduced into the silicon base layer 12 during the formation of the same, or alternatively the p-type dopant can be introduced into an intrinsic semiconductor material by utilizing ion implantation.

The boron doped silicon layer 14 having the second dopant concentration that is less than the first dopant concentration can be formed atop the silicon base layer 12 utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the boron doped silicon layer 14 has an epitaxial relationship, i.e., same crystal orientation, as that of the silicon base layer 12. In the present application, the silicon base layer 12 may have any crystallographic surface orientation such as, for example, {100}, {110} or {111}.

Examples of various epitaxial growth processes that are suitable for use in forming the boron doped silicon layer 14 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of boron doped silicon layer 14. In some embodiments, the source gas for the deposition of the boron doped silicon layer 14 includes a silicon containing gas source. Carrier gases like hydrogen, nitrogen, helium and argon can be used. In one embodiment, boron can be introduced into the source gas during the epitaxial deposition process. In another embodiment, boron can be introduced into an intrinsic silicon layer in a concentration that is sufficient to provide boron doped silicon layer 14 by utilizing ion implantation or gas phase doping.

Alternatively, it may be possible to first form a boron doped silicon material that has the second dopant concentration. Ion implantation of boron or another like p-type dopant can then be performed which forms the silicon base layer 12 of the bulk semiconductor substrate 10 shown in FIG. 1.

The thickness of the boron doped silicon layer 14 that can be formed is from 100 nm to 500 nm. Other thicknesses that are lesser than, or greater than, the aforementioned thickness range can also be employed in the present application. The second dopant concentration of the boron doped silicon layer 14 can be in a range from $1\times10^{18}$ atom/cm$^3$ to $5\times10^{18}$ atoms/cm$^3$. Other ranges for the second dopant concentration may also be employed in the present application as long as the second dopant concentration that is present in the boron doped silicon layer 14 is less than the first dopant concentration that is present in the silicon base layer 12.

Figure 2:
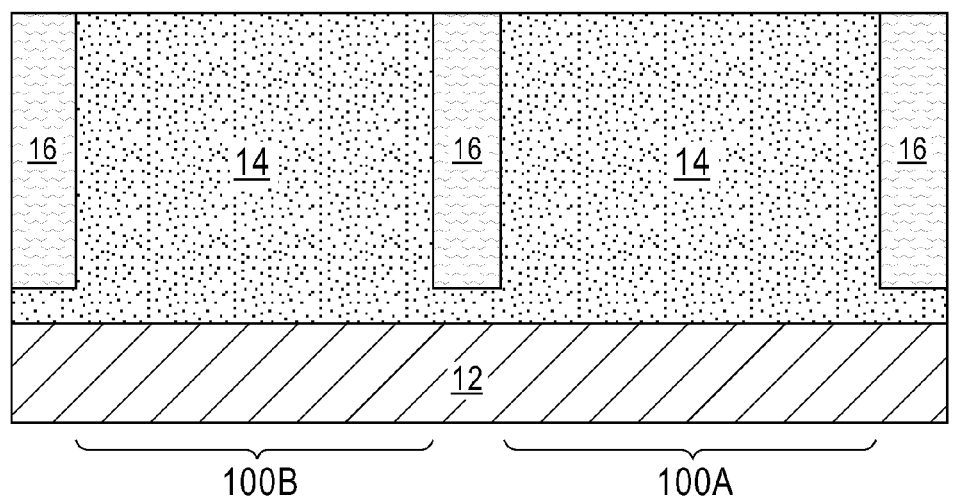
FIG. 2 is a cross sectional view of the exemplary semiconductor structure of FIG. 1 after forming a sacrificial trench isolation structure within the boron doped silicon layer to define a first device region containing a first boron doped silicon portion and a second device region containing a second boron doped silicon portion.

Referring now to FIG. 2, there is illustrated the exemplary semiconductor structure of FIG. 1 after forming a sacrificial trench isolation structure 16 within the boron doped silicon layer 14 to define a first device region 100A containing a first boron doped silicon portion and a second device region 100B containing a second boron doped silicon portion. Each boron doped silicon portion has the second dopant concentration and represents a non-etched portion of the boron doped silicon layer 14 in each device region (100A, 100B). Each sacrificial trench isolation structure 16 can be formed by first providing a trench within the boron doped silicon layer 14 that has a trench bottom that stops prior to reaching the topmost surface of the silicon base layer 12. The trench can be formed by lithography and etching. Lithography includes forming a photoresist material over the exemplary semiconductor structure shown in FIG. 1 by utilizing a deposition process such as, for example, spin-on coating, evaporation, chemical vapor deposition or plasma enhanced chemical vapor deposition. The deposited photoresist material is then subjected to a pattern of irradiation and thereafter the exposed photoresist material is developed utilizing a resist developer to provide a patterned photoresist. The pattern within the photoresist material is then transferred into the underlying boron doped silicon layer 16 utilizing an anisotropic etch such as, for example, reactive ion etching. Following the etch, the patterned photoresist material can be stripped from the exemplary semiconductor structure utilizing a resist stripping process such as, for example, ashing.

After forming the trench within the boron doped silicon layer 14, the trench is then filled with a trench dielectric material such as, for example, silicon dioxide or silicon nitride. The filling of the trench may include depositing the trench dielectric material utilizing any well known deposition process such as, for example, chemical vapor deposition or plasma enhanced vapor deposition. In some embodiments, a planarization process such as, for example, chemical mechanical polishing and/or grinding, may be used to remove any trench dielectric material that is formed outside the trench and atop the boron doped silicon layer 14.

Figure 3:
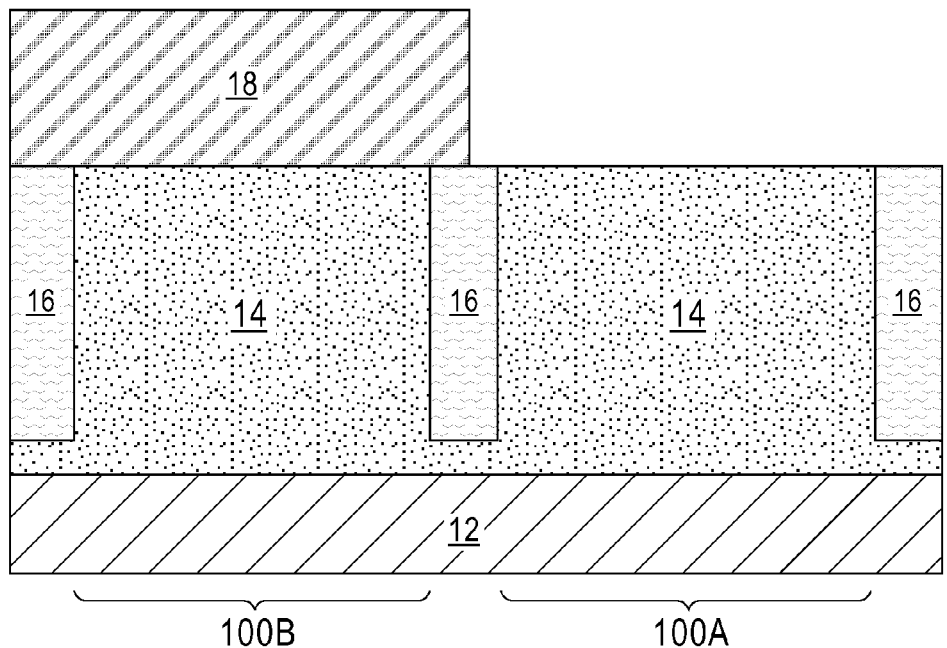
FIG. 3 is a cross sectional view of the exemplary semiconductor structure of FIG. 2 after providing a block mask over the second device region, while leaving the first device region exposed.

Referring now to FIG. 3, there is illustrated the exemplary semiconductor structure of FIG. 2 after providing a block mask 18 over the second device region 100B, while leaving the first device region 100A exposed. The block mask 18 serves as an implantation mask during the subsequent formation of a first buried doped region within the first boron doped silicon portion present in first device region 100A.

The block mask 18 that can be employed in the present application includes any material that can serve as a block mask to prevent dopant ions from being introduced into the second device region 100B containing the second boron doped silicon portion. In one embodiment, the block mask 18 may be composed of only a photoresist material. In another embodiment, the block mask 18 may be composed of only a hard mask material. Examples of hard mask materials that can be used as block mask 18 include silicon dioxide, silicon nitride and/or silicon oxynitride. In another embodiment of the present application, the block mask 18 may comprise a stack of, from bottom to top, a hard mask material and a photoresist material.

The block mask 18 can be formed utilizing techniques that are well known to those skilled in the art. For example, the block mask 18 can be formed by first depositing at least one of the above mentioned materials and then patterning the at least one deposited material by lithography. An anisotropic etching process such as, for example, reactive ion etching can also be used to complete any pattern transfer that may be needed; for example, an anisotropic etch may be used to transfer a pattern from a lithographically defined photoresist into the underlying material that may define the block mask 18.

Figure 4:
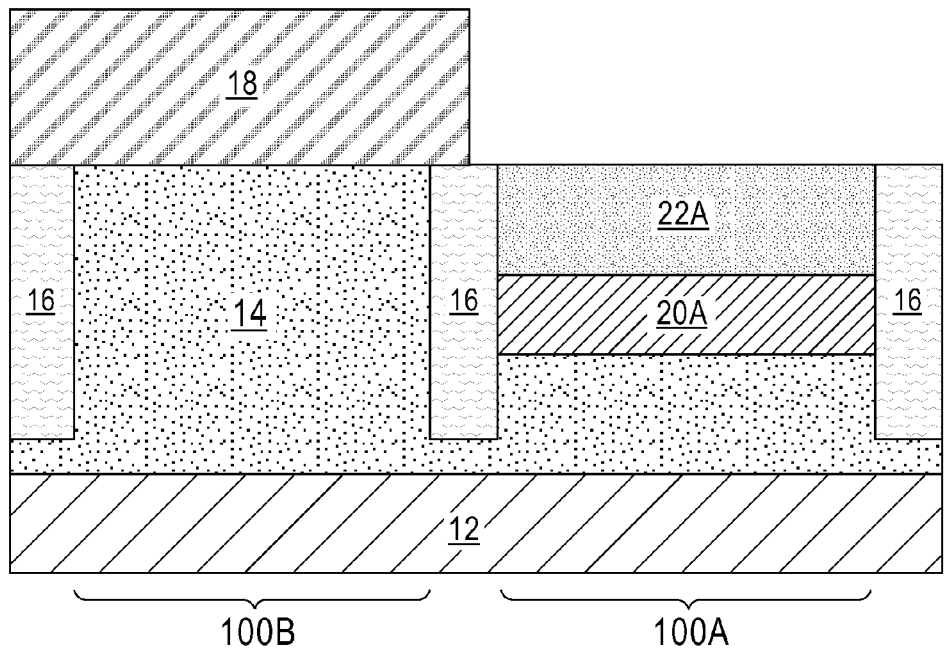
FIG. 4 is a cross sectional view of the exemplary semiconductor structure of FIG. 3 after forming a first buried boron doped region of a first depth and having a third dopant concentration that is greater than the second dopant concentration in the first boron doped silicon portion.

Referring now to FIG. 4, there is illustrated the exemplary semiconductor structure of FIG. 3 after forming a first buried boron doped region 20A of a first depth and having a third dopant concentration that is greater than the second dopant concentration in the first boron doped silicon portion. In the present application, the depth (i.e., first depth, and second depth) refers to a vertical distance as measured from the original topmost surface of the first boron doped silicon portion and the second boron doped silicon portion to the topmost surface of the buried region formed therein. For example, the first depth is a depth as measured from the topmost surface of the first boron doped silicon portion to the topmost surface of the first buried doped region 20A. In one embodiment of the present application, the first depth can be from 30 nm to 200 nm. Other first depths that are lesser than, or greater than, the aforementioned first depth range may also be employed in the present application.

The first buried boron doped region 20A is formed within the first boron doped silicon portion such that a topmost portion of the first boron doped silicon portion remains above the first buried boron doped region 20A. The topmost portion of the first boron doped silicon portion that remains above the first buried boron doped region 20A may be referred to herein as a remaining topmost first boron doped silicon portion 22A. The first depth mentioned above is equivalent to the thickness of the remaining topmost first boron doped silicon portion 22A. The first buried doped region 20A does not extend entirely through the first boron doped silicon portion. Instead, a portion of the boron doped silicon layer 14 is present beneath the first buried doped region 20A. The first buried doped region 20A includes silicon and boron.

The first buried boron doped region 20A is formed by implanting boron into the first boron doped portion of the boron doped silicon layer 14. The implanting of boron can be performed utilizing conditions that are well known in the art. In one example, the following boron implantation conditions can be used in forming the first boron doped region 20A: $BF_2$ can be used as the boron dopant source and the energy that is employed is dependent on the thickness of the remaining topmost first boron doped silicon portion 22A and desired thickness of the first buried boron doped region 20A.

As mentioned above, the first buried boron doped region 20A has a third dopant concentration that is greater than the second dopant concentration in the first boron doped silicon portion. In one embodiment of the present application, the third dopant concentration that is present in the first buried boron doped region 20A is from $1 \times 10^{20}$ atoms/cm$^3$ to $3 \times 10^{20}$ atoms/cm$^3$. Other ranges for the third dopant concentration may also be employed in the present application as long as the third dopant concentration that is present in the first buried boron doped region 20A is greater than the second dopant concentration that is present in the boron doped silicon layer 14; the third dopant concentration is also less than the first dopant concentration of the silicon base layer 12.

The first buried boron doped region 20A can have a thickness from 30 nm to 200 nm. Other thicknesses that are lesser than, or greater than, the aforementioned thickness range may be employed as long as the first buried doped region 20A remains buried within the boron doped silicon layer 14 that is present in the first device region 100A.

Figure 5:
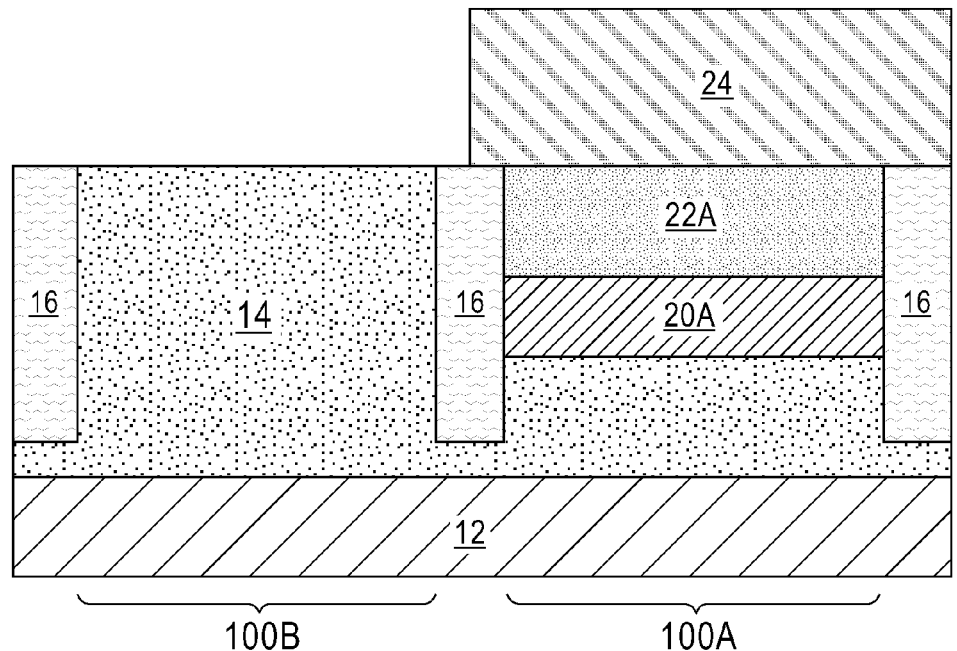
FIG. 5 is a cross sectional view of the exemplary semiconductor structure of FIG. 4 after removing the block mask over the second device region, and forming another block mask over the first device region.

Referring now to FIG. 5, there is illustrated the exemplary semiconductor structure of FIG. 4 after removing the block mask 18 over the second device region 100B, and forming another block mask 24 over the first device region 100A.

The block mask 18 can be removed utilizing any conventional process that can selectively remove the material or materials that provide the block mask 18. In one embodiment, and when the block mask is composed of a remaining portion of a photoresist material, the remaining portion of the photoresist material can be removed utilizing a resist stripping process such as, for example, ashing. In another embodiment, and when the block mask 18 is composed of hard mask material, a planarization process such as, for example, chemical mechanical polishing (CMP) or grinding may be used. Alternatively, an etching process can be used to selectively remove the hard mask material. When the hard mask 18 is comprised of a stack of, from bottom to top, a hard mask material and a photoresist material, the photoresist material can be removed first by utilizing a resist stripping process, and thereafter a planarization process or etching may be used to remove the hard mask material.

The another block mask 24 that is provided over the first device region 100A can be formed by one of techniques mentioned above in providing block mask 18 over the second device region 100B. The another block mask 24 may include one of the materials mentioned above for providing block mask 18. The another block mask 24 serves as an implantation mask during the subsequent formation of a second buried doped region within the second boron doped silicon portion present in second device region 100B.

Figure 6:
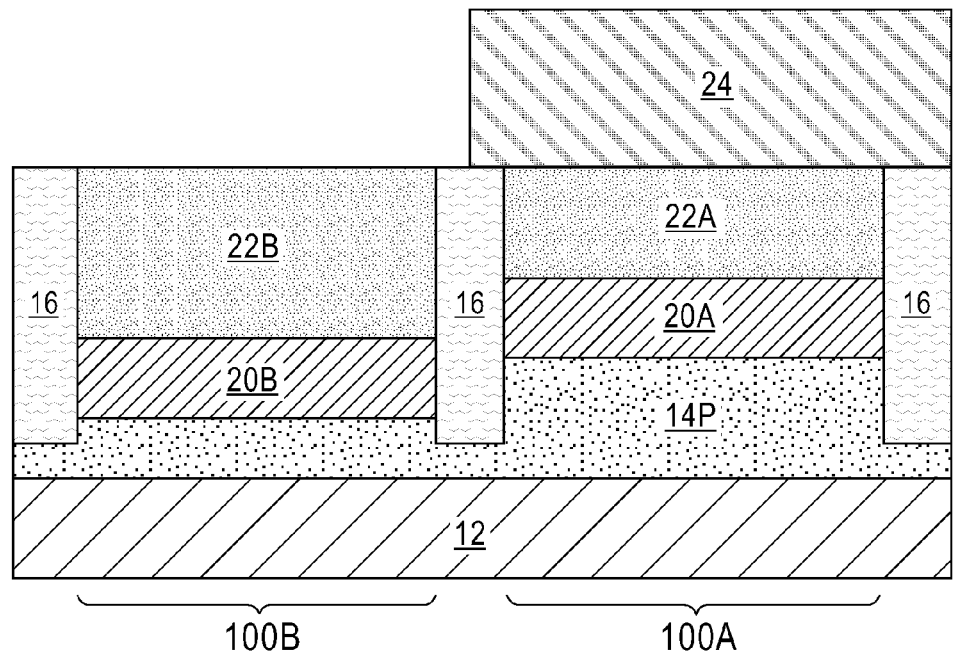
FIG. 6 is a cross sectional view of the exemplary semiconductor structure of FIG. 5 after forming a second buried boron doped region of a second depth and having the third dopant concentration in the second boron doped silicon portion, wherein the second depth is greater than the first depth.

Referring now to FIG. 6, there is illustrated the exemplary semiconductor structure of FIG. 5 after forming a second buried boron doped region 20B of a second depth and having the third dopant concentration in the second boron doped silicon portion, wherein the second depth is greater than the first depth. In one embodiment of the present application, the second depth can be from 50 nm to 200 nm. Other second depths that are lesser than, or greater than, the aforementioned second depth range may also be employed in the present application as long as the second depth is greater than the first depth of the first buried boron doped region 20A. The second buried boron doped region 20B includes silicon and boron.

The second buried boron doped region 20B is formed within the second boron doped silicon portion such that a topmost portion of the second boron doped silicon portion remains above the second buried boron doped region 20B. The topmost portion of the second boron doped silicon portion that remains above the second buried boron doped region 20B may be referred to herein as a remaining topmost second boron doped silicon portion 22B. The second depth mentioned above is equivalent to the thickness of the remaining topmost second boron doped silicon portion 22B. The second buried doped region 20B does not extend entirely through the second boron doped silicon portion. Instead, a portion of the boron doped silicon layer 14 is present beneath the second buried doped region 20B.

The second buried boron doped region 20B is formed by implanting boron into the second boron doped portion of the boron doped silicon layer 14. The implanting of boron can be performed utilizing conditions that are well known in the art. In one example, the following boron implantation conditions can be used in forming the second boron doped region 20B: $BF_2$ can be used as the boron dopant source and the energy that is employed is dependent on the thickness of the remaining topmost second boron doped silicon portion 22B and desired thickness of the second buried boron doped region 20B.

As mentioned above, the second buried boron doped region 20B has a third dopant concentration that is greater than the second dopant concentration in the second boron doped silicon portion. In one embodiment of the present application, the third dopant concentration that is present in the second buried doped region 20B is from $1 \times 10^{20}$ atoms/cm$^3$ to $3\times10^{20}$ atoms/cm$^3$. Other ranges for the third dopant concentration may also be employed in the present application as long as the third dopant concentration that is present in the second buried boron doped region 20B is greater than the second dopant concentration that is present in the boron doped silicon layer 14; the third dopant concentration is also less than the first dopant concentration of the silicon base layer 12.

The second buried boron doped region 20B can have a thickness from 50 nm to 200 nm. Other thicknesses that are lesser than, or greater than, the aforementioned thickness range may be employed as long as the second buried doped region 20B remains buried within the boron doped silicon layer 14 that is present in the second device region 100B.

After forming the second buried boron doped region 20B, a contiguous boron doped silicon portion 14P of boron doped silicon layer 14 remains and is present beneath each buried boron doped region (20A, 20B) and beneath the sacrificial trench isolation structure 16 that is located between the first device region 100A and the second device region 100B. The contiguous boron doped silicon portion 14P thus directly contacts a bottommost surface of the first boron doped region 20A and a bottommost surface of the second boron doped region 20B.

Also, and after forming the first and second buried boron doped regions (20A, 20B), the remaining topmost first boron doped silicon portion 22A is present above the first boron doped region 20A, and the remaining topmost second boron doped silicon portion 22B is present above the second boron doped region 20B. In the present embodiment, the remaining topmost second boron doped silicon portion 22B that is present above the second buried boron doped region 20B is thicker than the remaining topmost first boron doped silicon portion 22A that is present above the first buried boron doped region 20A.

Figure 7:
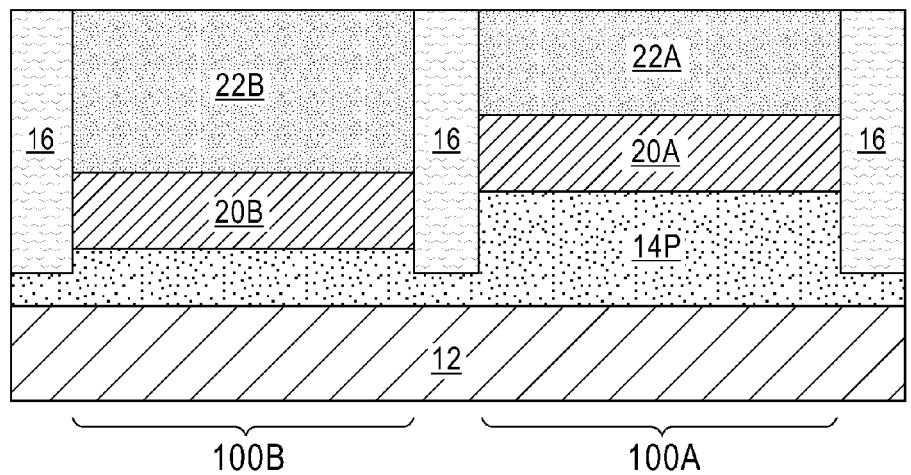
FIG. 7 is a cross sectional view of the exemplary semiconductor structure of FIG. 6 after removing the another block mask from over the first device region.

Referring now to FIG. 7, there is illustrated the exemplary semiconductor structure of FIG. 6 after removing the another block mask 24 from over the first device region 100A. The another block mask 24 can be removed from the exemplary semiconductor structure of FIG. 6 utilizing one of the techniques mentioned above in removing block mask 18 from the second device region 100B. The removal of the another block mask exposes the remaining topmost first boron doped silicon portion 22A.

Although the present application describes and illustrates the formation of the first buried boron doped region 20A prior to forming the second buried boron doped region 20B, the above mentioned processing steps can be varied to form the second buried boron doped region 20B prior to forming the first buried boron doped region 20A.

Figure 8:
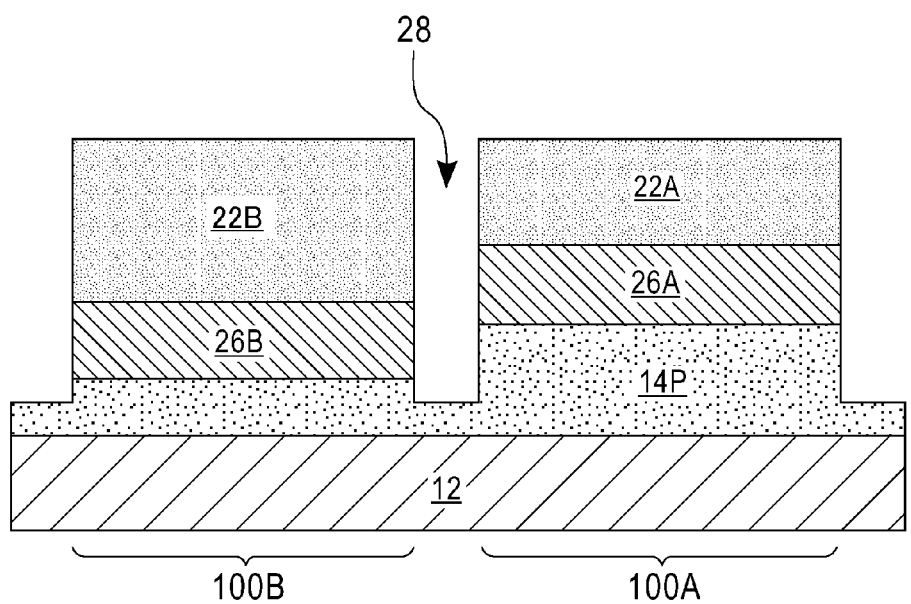
FIG. 8 is a cross sectional view of the exemplary semiconductor structure of FIG. 7 after performing an anodization process that converts the first buried boron doped region into a first porous silicon region of the first depth and the second buried boron doped region into a second porous silicon region of the second depth, while removing the sacrificial trench isolation structure.

Referring now to FIG. 8, there is illustrated the exemplary semiconductor structure of FIG. 7 after performing an anodization process that converts the first buried boron doped region 20A into a first porous silicon region 26A of the first depth and the second buried boron doped region 20B into a second porous silicon region 26B of the second depth, while removing the sacrificial trench isolation structure 16 to form trench 28. The term "porous silicon" as used throughout the present application denotes silicon in which nanoporous holes have been introduced into its microstructure, rendering a large surface to volume ratio which may be in the order of 500 m$^2$/cm$^3$.

The anodization process is performed by immersing the structure shown in FIG. 7 into a HF-containing solution while an electrical bias is applied to the structure with respect to an electrode (typically a negative electrode) also placed in the HF-containing solution. In such a process, the silicon base layer 12 typically serves as the positive electrode of the electrochemical cell, while a metal such as platinum is employed as the negative electrode. In general, the anodization process in the HF-containing solution converts each boron doped region (20A, 20B) into a porous silicon region (26A, 26B). The HF-containing solution also selectively removes the material that provides the sacrificial trench isolation structure 16. The rate of formation and the nature of the porous silicon region (26A, 26B) so-formed (porosity and microstructure) is determined by both the material properties, i.e., doping type and concentration, as well as the reaction conditions of the anodization process itself (current density, bias, illumination and additives in the HF-containing solution). Generally, each porous silicon region (26A, 26B) that is provided in the present application has a porosity of about 0.1% or higher.

The term "HF-containing solution" includes concentrated HF (49%), a mixture of HF and water, a mixture of HF and a monohydric alcohol such as methanol, ethanol, propanol, etc, or HF mixed with at least one surfactant. The amount of surfactant that is present in the HF-containing solution is typically from about 1 to about 50%, based on 49% HF.

The anodization process of the present application can be performed using a constant current source that operates at a current density from 0.05 milliAmps/cm$^2$ to 50 milliAmps/cm$^2$. A light source may be optionally used to illuminate the sample. The anodization process is typically performed at room temperature (from 20° C. to 30° C.) or, a temperature that is elevated from room temperature may be used. In one example, the elevate temperature may be from 30° C. up to 100° C.

Following the anodization process, the structure shown in FIG. 8 is typically rinsed with deionized water and dried. Anodization typically occurs for a time period of less than 10 minutes, with a time period of less than 1 minute being more typical.

After the anodization process, the contiguous boron doped silicon portion 14P remains and is present beneath each porous silicon region (26A, 26B) and beneath the trench 28 that is located between the first device region 100A and the second device region 100B. The contiguous boron doped silicon portion 14P thus directly contacts a bottommost surface of the first porous silicon region 26A and a bottommost surface of the second porous silicon region 26B.

After the anodization, the remaining topmost portion of the first boron doped silicon portion 22A is present above the first porous silicon region 26A, and the remaining topmost portion of the second boron doped silicon portion 22B is present above the second porous silicon region 26B.

Figure 9:
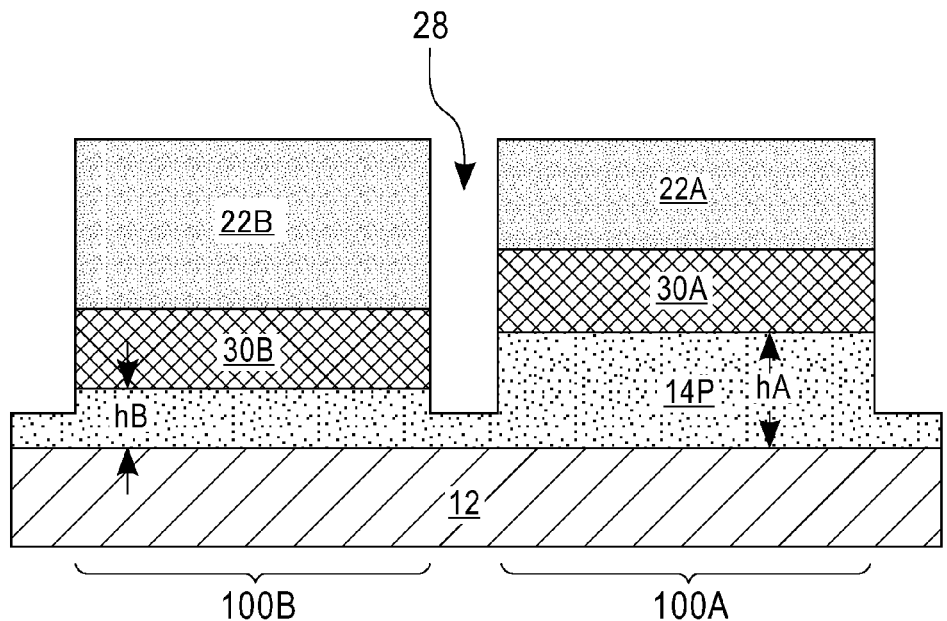
FIG. 9 is a cross sectional view of the exemplary semiconductor structure of FIG. 8 after performing an oxidation anneal that converts the first porous silicon region into a first buried oxide structure of the first depth and the second porous silicon region into a second buried oxide structure of the second depth.

Referring now to FIG. 9, there is illustrated the exemplary semiconductor structure of FIG. 8 after performing an oxidation anneal that converts the first porous silicon region 26A into a first buried oxide structure 30A of the first depth and the second porous silicon region 26B into a second buried oxide structure 30B of the second depth. In the present application, the porous silicon regions 26A, 26B serve as an oxygen sponge thus oxidation occurs within the porous silicon regions 26A, 26B.

The oxidation anneal that can be employed in the present application can be performed in an oxidizing ambient such as, for example, oxygen, air, ozone, water vapor, and/or NO$_2$. In some embodiments, the oxidizing ambient can be admixed with an inert gas such as, for example, He, Ar and/or Ne. In such an embodiment, the inert gas constituent from 2 volume % to 95 volume % of an oxidizing ambient containing admixture. The oxidation anneal can be performed at a temperature from 400° C. to 1100° C. The oxidation anneal may include a furnace anneal, a rapid thermal anneal or any other anneal that can convert the first porous silicon region 26A into the first buried oxide structure 30A of the first depth and the second porous silicon region 26B into the second buried oxide structure 30B of the second depth.

In the present application, the first buried oxide structure 30A and the second buried oxide structure 30B are comprised of silicon dioxide. In the illustrated embodiment, the first buried oxide structure 30A that is formed has a bottommost surface that is present above a bottommost surface of the second buried oxide structure 30B. Also, and in the illustrated embodiment, the topmost surface of the first buried oxide structure 30A is located above a topmost surface of the second buried oxide structure 30B.

After the oxidation anneal, the contiguous boron doped silicon portion 14P remains and is beneath the first and second buried oxide structures 30A, 30B and beneath the trench 28 that is located between the first device region 100A and the second device region 100B. The contiguous boron doped silicon portion 14P thus directly contacts a bottommost surface of the first buried oxide structure 30A and a bottommost surface of the second buried oxide surface 30B. In this embodiment of the present application, the thickness, i.e., $h_B$, of the contiguous boron doped silicon portion 14P that is located directly beneath the second buried oxide structure 30B is less than the thickness i.e., $h_A$, of the contiguous boron doped silicon portion 14P that is located directly beneath the second buried oxide structure 30B.

After the oxidation anneal, the remaining topmost portion of the first boron doped silicon portion 22A is present above the first buried oxide structure 30A, and the remaining topmost portion of the second boron doped silicon portion 22B is present above the second oxide structure 30B.

Figure 10:
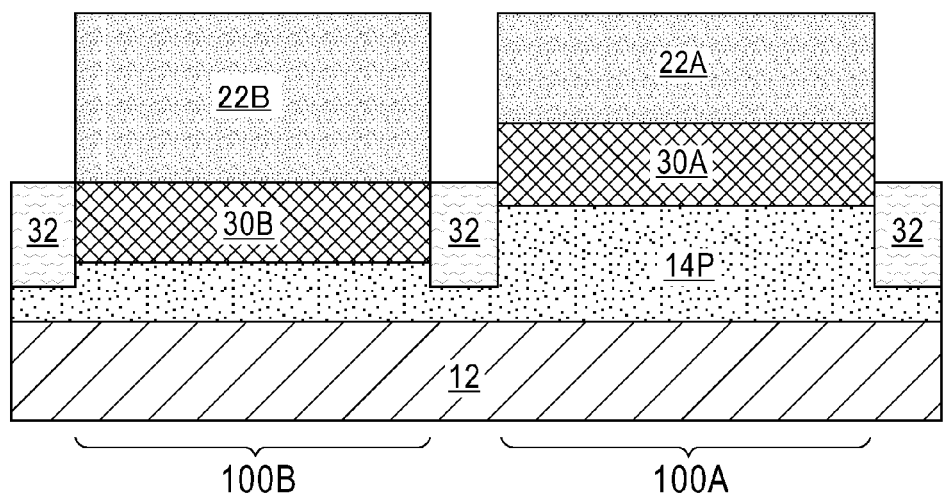
FIG. 10 is a cross sectional view of the exemplary semiconductor structure of FIG. 9 after forming an isolation structure within a bottom portion of a trench that previously included the sacrificial trench isolation structure.

Referring now to FIG. 10, there is illustrated the exemplary semiconductor structure of FIG. 9 after forming an isolation structure 32 within a bottom portion of trench 28 that previously included the sacrificial trench isolation structure 16. As is shown, the isolation structure 32 that is located between the first device region 100A and the second device region 100B has a sidewall surface that directly contacts a sidewall surface of the first buried oxide structure 30A and another sidewall surface that directly contacts a sidewall surface of the second buried oxide structure 30B. In some embodiments and as shown, the topmost surface of each isolation structure 32 can be coplanar with a topmost surface of the second buried oxide structure 30B. In some embodiments and as further shown, the topmost surface of each isolation structure 32 is located above a bottommost surface of the first buried oxide structure 30A.

Each isolation structure 32 that is formed comprises a trench dielectric material such as, for example, an oxide or nitride. In one example, silicon dioxide can be used as the trench dielectric material. The trench dielectric material can be formed by a deposition process including, for example, chemical vapor deposition or plasma enhanced chemical vapor deposition. The deposition process may overfill each trench with the trench dielectric material. In such an embodiment, a planarization process such as, for example, chemical mechanical polishing and/or grinding may be first used to reduce the height of the deposited trench dielectric material to a height of the remaining topmost first and second boron doped silicon portions (22A, 22B) shown in FIG. 9. After planarization, an etch back process can be used to form each isolation structure 32. In yet another embodiment, the deposition process may partially fill each trench with a trench dielectric material. In some embodiments, a recess etch may, or may not, be employed to provide each isolation structure 32.

Figure 11:
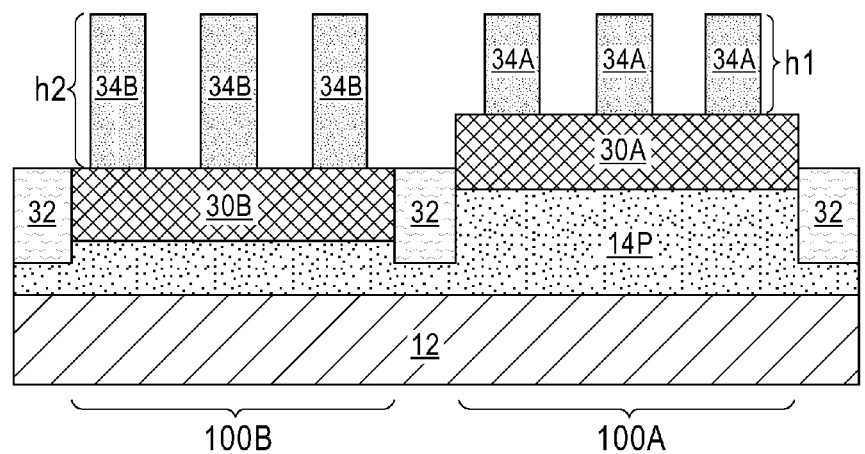
FIG. 11 is a cross sectional view of the exemplary semiconductor structure of FIG. 10 after patterning a remaining topmost portion of the first boron doped silicon portion to provide first silicon fins of a first height on the first buried oxide structure, and a remaining topmost portion of the second boron doped silicon portion to provide second silicon fins of a second height on the second buried oxide structure, wherein the second height is greater than the first height, yet the topmost surfaces of each first silicon fin and each second silicon fin are coplanar with each other.

Referring now to FIG. 11, there is illustrated the exemplary semiconductor structure of FIG. 10 after patterning the remaining topmost first boron doped silicon portion 22A to provide first silicon fins 34A of a first height, h1, on the first buried oxide structure 30A, and the remaining topmost second boron doped silicon portion 22B to provide second silicon fins 34B of a second height, h2, on the second buried oxide structure 30B, wherein the second height is greater than the first height, yet the topmost surfaces of each first silicon fin 34A and each second silicon fin 34B are coplanar with each other. Although a plurality of first silicon fins 34A and a plurality of second silicon fins 34B is described and illustrated, the present application contemplates an embodiment in which a single first silicon fin 34A and/or a single second silicon fin 34B can be formed.

Each silicon fin (34A, 34B) can be formed by patterning the corresponding remaining topmost boron doped silicon portions (22A, 22B). In one embodiment, the patterning process used to define each silicon fin (34A, 34B) comprises a sidewall image transfer (SIT) process. The SIT process includes forming a contiguous mandrel material layer (not shown) on the remaining topmost boron doped silicon portions (22A, 22B). The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each silicon fin (34A, 34B).

After formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into remaining topmost boron doped silicon portions (22A, 22B). The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process used to define each silicon fin (34A, 34B) can include lithography and etching. Lithography includes forming a photoresist material (not shown) on the remaining topmost boron doped silicon portions (22A, 22B). The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

As used herein, a "fin" refers to a contiguous semiconductor material, in the present case silicon, and including a pair of vertical sidewalls that are parallel to each other. As used herein, a surface is "vertical" if there exists a vertical plane from which the surface does not deviate by more than three times the root mean square roughness of the surface. Each first silicon fin 34A that is formed has a first height that can be from 30 nm to 200 nm, while each second silicon fin 34B that is formed has a second height that can be from 50 nm to 200 nm. Other first heights and second heights that are lesser than, or greater than, the ranges mentioned above can also be employed as the height of each first silicon fin 34A and each second silicon fin 34B, so long as the height (i.e., the second height) of each second fin 34B is greater than a height (i.e., the first height) of each first silicon fin 34A.

Figure 12:
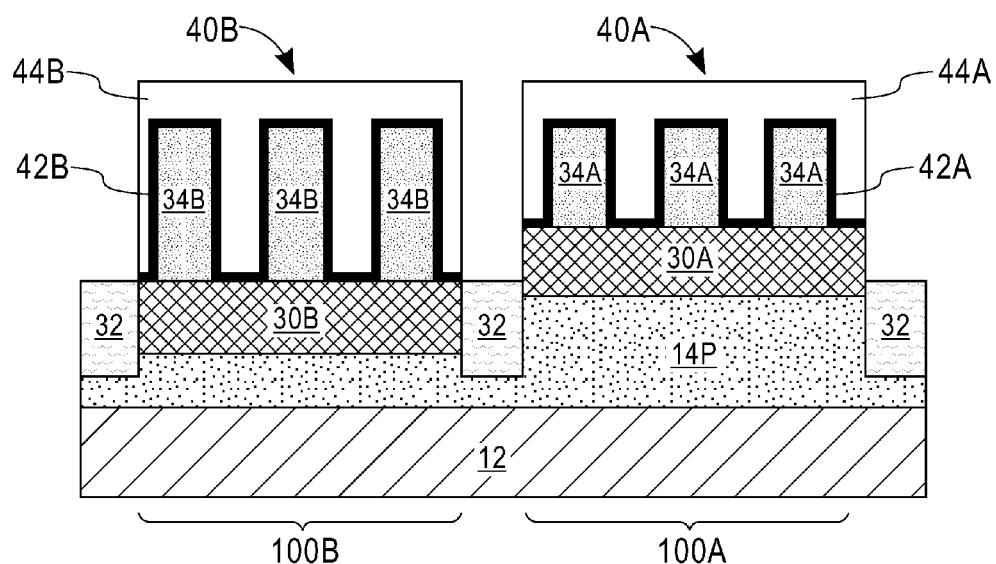
FIG. 12 is a cross sectional view of the exemplary semiconductor structure of FIG. 11 after forming a first functional gate structure straddling each first silicon fin, and a second functional gate structure straddling each second silicon fin.

Referring now to FIG. 12, there is illustrated the exemplary semiconductor structure of FIG. 11 after forming a first functional gate structure 40A straddling each first silicon fin 34A, and a second functional gate structure 40B straddling each second silicon fin 34B. Although the present application describes and illustrates the formation of a single first functional gate structure 40A and a single second functional gate structure 40B, a plurality of first and/or second gate structures can be formed. The term "straddling" denotes that each functional gate structure (40A, 40B) is formed across a silicon fin (34A, 34B) such that a first portion of each functional gate structure (40A, 40B) is present on one side of the silicon fin (34A, 34B), and a second portion of each functional gate structure (40A, 40B) is present on another side of the silicon fin (34A, 34B).

As shown in FIG. 12, a portion of the first functional gate structure 40A is located on a topmost surface of first buried oxide structure 30A, and a portion of the second functional gate structure 40B is located on a topmost surface of second buried oxide structure 30B. As further shown in FIG. 12, a topmost surface of the first functional gate structure 40A is coplanar with a topmost surface of the second functional gate structure 40B, and the first and second functional gate structures (40A, 40B) are spaced apart from each other.

By "functional gate structure" it is meant a permanent gate structure used to control output current (i.e., flow of carriers in the channel) of a semiconducting device through electrical or magnetic fields. Each functional gate structure (40A, 40B) that is formed includes a gate material stack of, from bottom to top, a gate dielectric portion (42A, 42B) and a gate conductor portion (44A, 44B). In some embodiments, a gate cap portion (not shown) can be present atop the gate conductor portion (44A, 44B).

The gate dielectric portion (42A, 42B) comprises a gate dielectric material. The gate dielectric material that provides the gate dielectric portion (42A, 42B) can be an oxide, nitride, and/or oxynitride. In one example, the gate dielectric material that provides the gate dielectric portion (42A, 42B) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion (42A, 42B).

The gate dielectric material used in providing the gate dielectric portion (42A, 42B) can be formed by any deposition process including, for example, chemical vapor deposition (CVD), plasma enhanced chemical vapor deposition (PECVD), physical vapor deposition (PVD), sputtering, or atomic layer deposition. In some embodiments, gate dielectric portion 42A comprises a same gate dielectric material as gate dielectric portion 42B. In other embodiments, gate dielectric portion 42A may comprise a first gate dielectric material, while gate dielectric portion 42B may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion (42A, 42B) can have a thickness in a range from 1 nm to 10 nm. Other thicknesses that are lesser than, or greater than, the aforementioned thickness range can also be employed for the gate dielectric material.

The gate conductor portion (44A, 44B) comprises a gate conductor material. The gate conductor material used in providing the gate conductor portion (44A, 44B) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Gate conductor portion 42A may comprise a same gate conductor material as, or a different gate conductor material from gate conductor portion 42B. In some embodiments, gate conductor portion 44A may comprise an nFET gate metal, while gate conductor portion 44B may comprise a pFET gate metal. In other embodiments, gate conductor portion 44A may comprise a pFET gate metal, while gate conductor portion 44B may comprise an nFET gate metal.

The gate conductor material used in providing the gate conductor portion (44A, 44B) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions (44A, 44B), block mask technology can be used. In one embodiment, the gate conductor material used in providing the gate conductor portion (44A, 44B) has a thickness from 1 nm to 100 nm. Other thicknesses that are lesser than, or greater than, the aforementioned thickness range can also be employed for the gate conductor material used in providing the gate conductor portion (44A, 44B).

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure (40A, 40B) can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, first and second sacrificial gate structures are first provided instead of the first and second functional gate structures (40A, 40B). In another embodiment, at least one functional gate structure can be first provided straddling one of the sets of silicon fins (34A, 34B), and at least one sacrificial gate structure can formed straddling another of the sets of the silicon fins (34A, 34B).

By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion (42A, 42B). The sacrificial gate material portion includes one of the gate conductor materials mentioned above for gate conductor portion (44A, 44B). The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional and/or sacrificial gate structure) source/drain regions (not shown) can be formed utilizing an epitaxial growth process from exposed portions of the first and second fins (34A, 34B) that are not protected by the gate structure; the source/drain regions would by located within a plane that runs into and out of the drawing illustrated in FIG. 12. The source/drain regions comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

Figure 13:
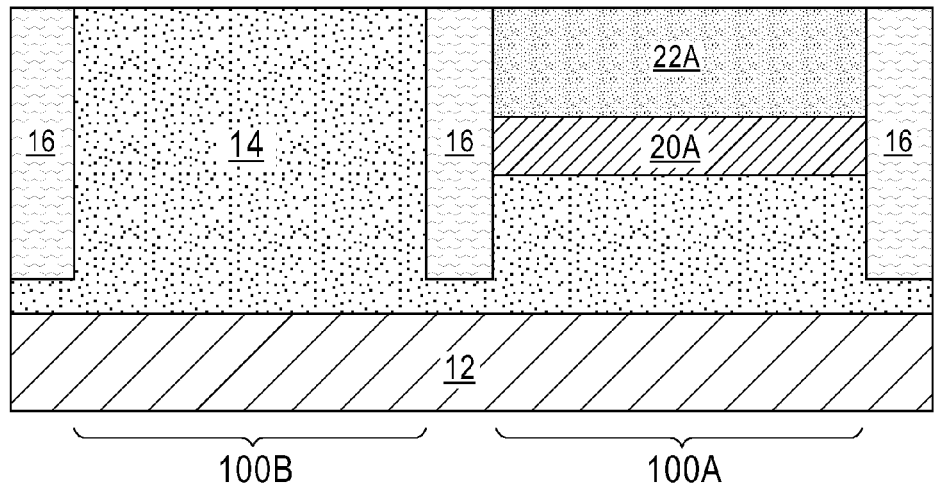
FIG. 13 is a cross sectional view of the exemplary semiconductor structure of FIG. 4 after removing the block mask over the second device region in accordance with another embodiment of the present application.

Referring now to FIG. 13, there is illustrated the exemplary semiconductor structure of FIG. 4 after removing the block mask 18 over the second device region 100B in accordance with another embodiment of the present application. Block mask 18 can be removed utilizing any of the techniques mentioned above in removing block mask 18 from atop the exemplary semiconductor structure of FIG. 5.

Figure 14:
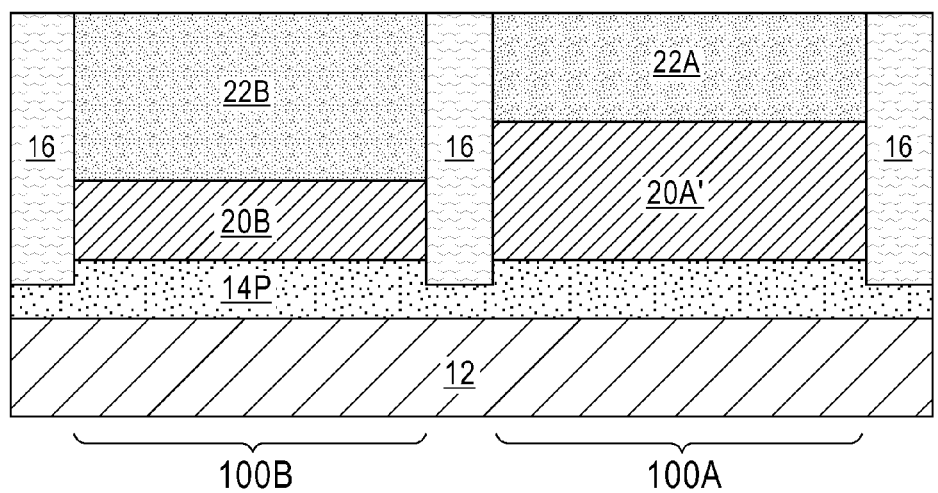
FIG. 14 is a cross sectional view of the exemplary semiconductor structure of FIG. 13 after forming a second buried boron doped region of a second depth and having the third dopant concentration in the second boron doped silicon portion and a remaining portion of the first boron doped silicon portion that is located directly beneath the first buried boron doped region, wherein the second depth is greater than the first depth.

Referring now to FIG. 14, there is illustrated the exemplary semiconductor structure of FIG. 13 after forming a second buried boron doped region 20B of a second depth and having the third dopant concentration in the second boron doped silicon portion, wherein the second depth is greater than the first depth. Since no block mask is present, a second buried doped region forms within a remaining portion of the first boron doped silicon portion that is located directly beneath the first buried boron doped region 20A. In the illustrated embodiment, element 20A' represents a combination of the first boron doped region and the second boron doped region that is formed in the first device region 100A by this embodiment of the present application. In this embodiment, the bottommost surface of the second buried boron doped region 20B is coplanar with a bottommost surface of buried boron doped region 20A'. The second buried boron doped region 20B and the lower portion of the buried boron doped region 20A' present in the first device region 100A can be formed as described above in providing the second boron doped region 20B to the exemplary semiconductor structure shown in FIG. 6 of the present application.

Figure 15:
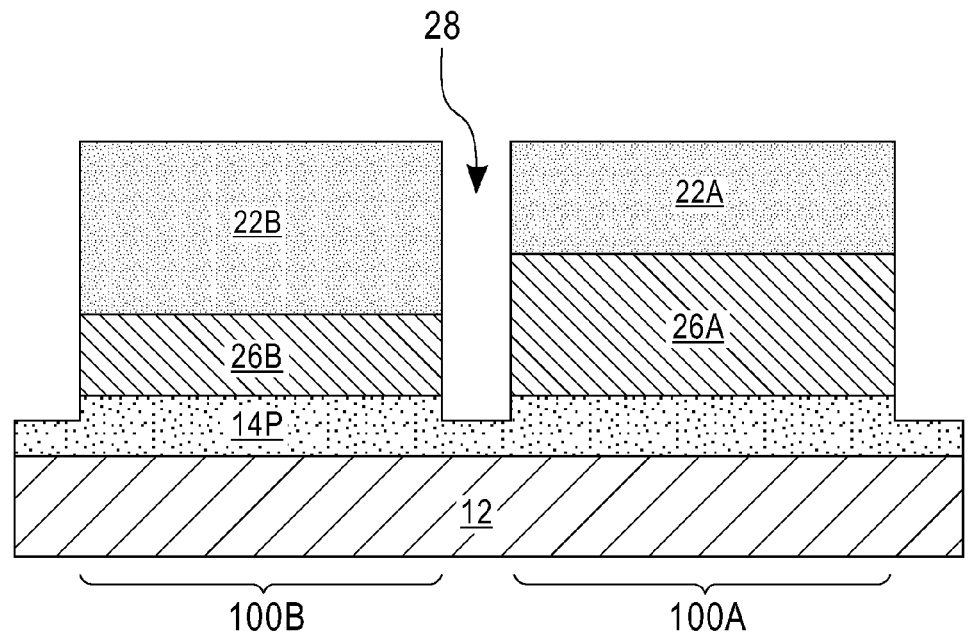
FIG. 15 is a cross sectional view of the exemplary semiconductor structure of FIG. 14 after performing an anodization process that converts the first buried boron doped region and the underlying second buried dopant region present in the first device region into a first porous silicon region of the first depth and the second buried boron doped region in the second device region into a second porous silicon region of the second depth, while removing the sacrificial trench isolation structure.

Referring now to FIG. 15, there is illustrated the exemplary semiconductor structure of FIG. 14 after performing an anodization process that converts the first buried boron doped region and the underlying second buried dopant region present in the first device region 100A (i.e., boron doped region 20A') into a first porous silicon region 26A of the first depth and the second buried boron doped region 20B in the second device region 100B into a second porous silicon region 26B of the second depth, while removing the sacrificial trench isolation structure 16. The anodization process of this embodiment of the present application includes the anodization process mentioned above in the previous embodiment of the present application. In this embodiment of the present application, the height of the contiguous boron doped silicon portion 14P that is present beneath the first and second porous silicon regions (26A, 26B) is the same.

Figure 16:
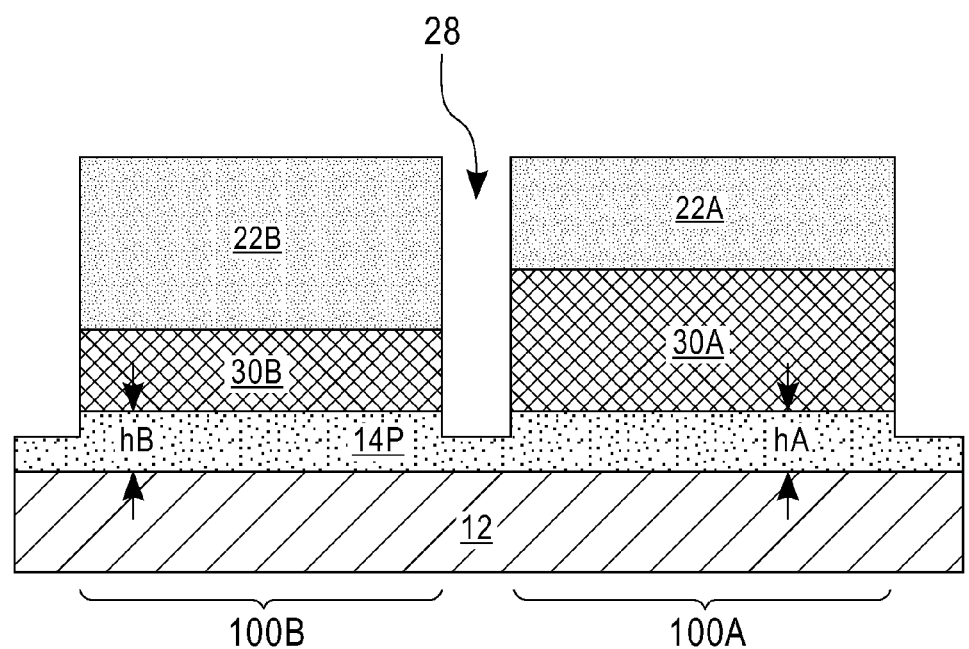
FIG. 16 is a cross sectional view of the exemplary semiconductor structure of FIG. 15 after performing an oxidation anneal that converts the first porous silicon region into a first buried oxide structure of the first depth and the second porous silicon region into a second buried oxide structure of the second depth.

Referring now to FIG. 16, there is illustrated the exemplary semiconductor structure of FIG. 15 after performing an oxidation anneal that converts the first porous silicon region 26A into a first buried oxide structure 30A of the first depth and the second porous silicon region 26B into a second buried oxide structure 30B of the second depth. The oxidation anneal of this embodiment of the present application includes the oxidation anneal mentioned above in the previous embodiment of the present application. In this embodiment, the first buried oxide structure 30A has a topmost surface that is located above a topmost surface of the second buried oxide structure 30B. Also, in this embodiment, the bottommost surface of the first buried oxide structure 30A is coplanar with a bottommost surface of the second buried oxide structure 30B. Further and in this embodiment of the present application, the height of the contiguous boron doped silicon portion 14P that is present beneath the first and second buried oxide structures (30A, 30B) is the same.

Figure 17:
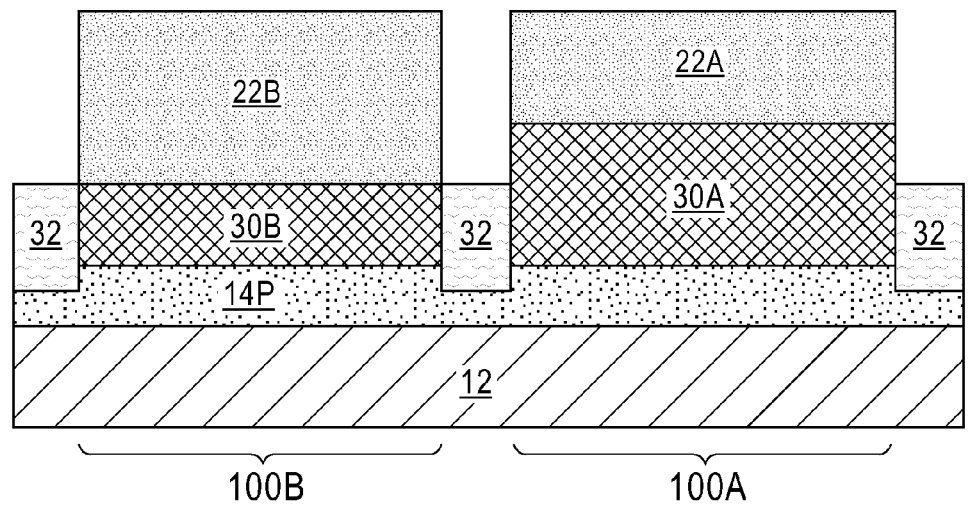
FIG. 17 is a cross sectional view of the exemplary semiconductor structure of FIG. 16 after forming an isolation structure within a bottom portion of a trench that previously included the sacrificial trench isolation structure.

Referring now to FIG. 17, there is illustrated the exemplary semiconductor structure of FIG. 16 after forming an isolation structure 32 within a bottom portion of a trench that previously included the sacrificial trench isolation structure 16. The isolation structure 32 of this embodiment of the present application includes the same material as the isolation structure 32 mentioned above in the previous embodiment of the present application. Also, the isolation structure 32 of this embodiment of the present application can be formed utilizing the technique mentioned above in forming the isolation structure 32 shown in FIG. 10 of the present application.

Figure 18:
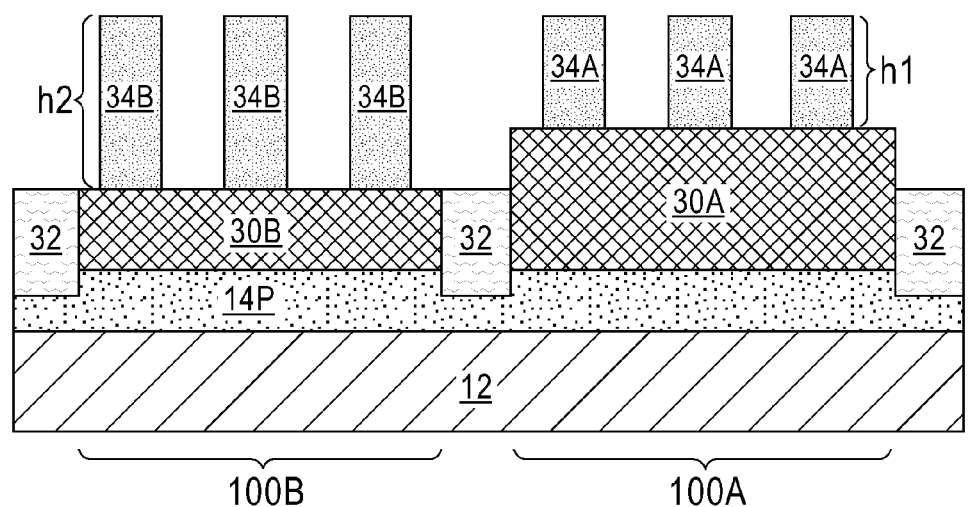
FIG. 18 is a cross sectional view of the exemplary semiconductor structure of FIG. 17 after patterning a remaining topmost portion of the first boron doped silicon portion to provide first silicon fins of a first height on the first buried oxide structure, and a remaining topmost portion of the second boron doped silicon portion to provide second silicon fins of a second height on the second buried oxide structure, wherein the second height is greater than the first height, yet the topmost surfaces of each first silicon fin and each second silicon fin are coplanar with each other.

Referring now to FIG. 18, there is illustrated the exemplary semiconductor structure of FIG. 17 after patterning the remaining topmost first boron doped silicon portion 22A to provide first silicon fins 34A of a first height on the first buried oxide structure 30A, and the remaining topmost second boron doped silicon portion 22B to provide second silicon fins 34B of a second height on the second buried oxide structure 30B, wherein the second height is greater than the first height, yet the topmost surfaces of each first silicon fin 34A and each second silicon fin 34B are coplanar with each other. The patterning process of this embodiment of the present application can include one of the patterning processes mentioned above for providing the first and second silicon fins (34A, 34B) within the exemplary semiconductor structure shown in FIG. 11 of the present application.

Figure 19:
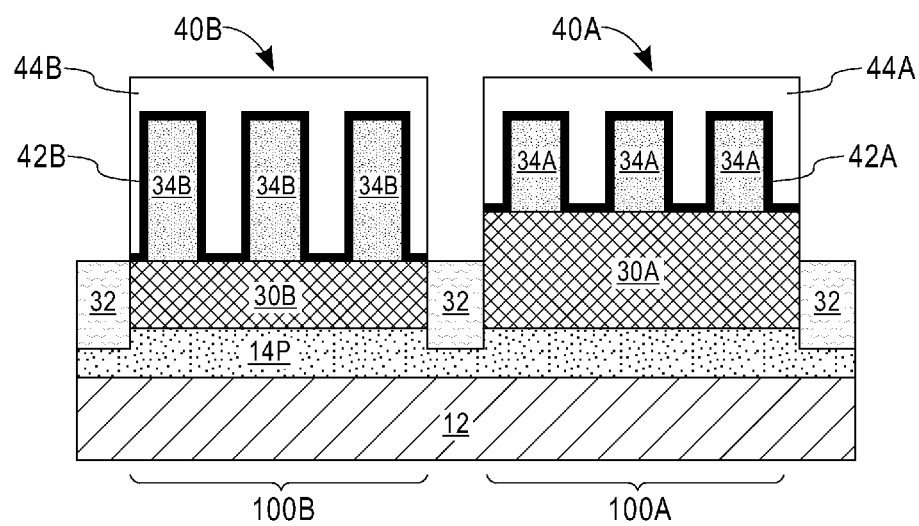
FIG. 19 is a cross sectional view of the exemplary semiconductor structure of FIG. 18 after forming a first functional gate structure straddling each first silicon fin, and a second functional gate structure straddling each second silicon fin.

Referring now to FIG. 19, there is illustrated the exemplary semiconductor structure of FIG. 18 after forming a first functional gate structure 40A straddling each first silicon fin 34A, and a second functional gate structure 40B straddling each second silicon fin 34B. The first and second functional gate structures (40A, 40B) of this embodiment of the present application includes the same materials as the first and second functional gate structures (40A, 40B) mentioned above in the previous embodiment of the present application. Also, the first and second functional gate structures (40A, 40B) of this embodiment of the present application can be formed utilizing the technique mentioned above in forming the first and second functional gate structures (40A, 40B) shown in FIG. 12 of the present application. In some embodiments and as also mentioned above at least one of the functional gate structures (40A, 40B) can be a sacrificial gate structure which is replaced with a functional gate structure after source/drain region formation.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing a bulk semiconductor substrate of, from bottom to top, a silicon base layer having a p-type conductivity and a first dopant concentration, and a boron doped silicon layer having a second dopant concentration that is less than said first dopant concentration;
   forming a sacrificial trench isolation structure within said boron doped silicon layer to define a first boron doped silicon portion and a second boron doped silicon portion;
   forming a first porous silicon region of a first depth in said first boron doped portion and located beneath a remaining topmost portion of said first boron doped silicon portion, and a second porous silicon region of a second depth in said second boron doped portion and located beneath a remaining topmost portion of said second boron doped silicon portion, wherein said second depth is greater than said first depth;
   converting said first porous silicon region into a first buried oxide structure of said first depth and said second porous silicon region into a second buried oxide structure of said second depth; and
   patterning said remaining topmost portion of said first boron doped silicon portion to provide a first silicon fin of a first height on said first buried oxide structure, and said remaining topmost portion of said second boron doped silicon portion to provide a second silicon fin of a second height on said second buried oxide structure, wherein said second height is greater than said first height, yet said topmost surfaces of each first silicon fin and each second silicon fin are coplanar with each other.

2. The method of claim 1, wherein said sacrificial trench isolation structure is removed to provide a trench during said forming said first porous silicon region and said second porous silicon region.

3. The method of claim 2, further comprising forming an isolation structure within a bottom portion of said trench.

4. The method of claim 1, wherein said forming said first porous silicon region and said second porous silicon region comprises:
   forming, in any order, a first buried boron doped region of said first depth and having a third dopant concentration that is greater than the second dopant concentration in said first boron doped silicon portion, and a second buried boron doped region of said second depth and having said third dopant concentration in the second boron doped silicon portion; and
   performing an anodization process to convert said first buried boron doped region into said first porous silicon region and said second buried boron doped region into said second porous silicon region.

5. The method of claim 1, wherein said forming said first porous silicon region and said second porous silicon region comprises:
   forming a block mask over said second boron doped silicon portion;
   implanting boron into said first boron doped silicon portion to provide said first buried boron doped region of said first depth and said third dopant concentration;
   removing said block mask from atop said second boron doped silicon portion;
   forming another block mask over said first boron doped silicon portion;

implanting boron into said second boron doped silicon portion to provide said second buried boron doped region of said second depth and said third dopant concentration;

removing said another block mask; and performing an anodization process to convert said first buried boron doped region into said first porous silicon region and said second buried boron doped region into said second porous silicon region.

6. The method of claim 1, wherein said forming said first porous silicon region and said second porous silicon region comprises:

forming a block mask over said second boron doped silicon portion;

implanting boron into said first boron doped silicon portion to provide said first buried boron doped region of said first depth and said third dopant concentration;

removing said block mask from atop said second boron doped silicon portion;

implanting boron into said second boron doped silicon portion to provide said second buried boron doped region of said second depth and said third conductivity, while simultaneously forming another buried boron doped region of said second depth directly beneath said first buried boron doped region; and performing an anodization process to convert said first buried boron doped region and said another buried boron doped region into said first porous silicon region and said second buried boron doped region into said second porous silicon region.

7. The method of claim 1, wherein said converting said first porous silicon region into said first buried oxide structure and said second porous silicon region into said second buried oxide structure comprises an oxidation anneal.

8. The method of claim 1, wherein a bottommost surface of said first buried oxide structure is located above or is coplanar with a bottommost surface of said second buried oxide structure.

9. The method of claim 8, wherein a topmost surface of said first buried oxide structure is located above a topmost surface of said second buried oxide structure.

10. The method of claim 1, further comprising forming a first gate structure straddling said first silicon fin and a second gate structure straddling said second silicon fin.

11. The method of claim 10, wherein said first gate structure and said second gate structure are both functional gate structures.

12. The method of claim 10, wherein said first gate structure and said second gate structures are both sacrificial gate structures that are replaced with functional gate structure after forming source/drain regions on an exposed portion of said first silicon fin and said second silicon fin.

13. The method of claim 1, wherein said patterning said remaining topmost portion of said first boron doped silicon portion and said remaining topmost portion of said second boron doped silicon portion comprises a sidewall image transfer process.

\* \* \* \* \*